United States Patent
Haas et al.

(10) Patent No.: US 8,840,797 B2
(45) Date of Patent: Sep. 23, 2014

(54) MULTILAYER CERAMIC STRUCTURE AND METHOD FOR PRODUCING THE SAME

(75) Inventors: Thomas Haas, Berg (DE); Dieter Schwanke, Hof (DE); Achim Bittner, Burgkundstadt (DE); Ulrich Schmid, Vienna (AT)

(73) Assignees: Micro Systems Engineering GmbH, Berg (DE); Technische Universitaet Wien, Vienna (AT)

( * ) Notice: Subject to any disclaimer, the term of this patent is extended or adjusted under 35 U.S.C. 154(b) by 0 days.

(21) Appl. No.: 13/542,746

(22) Filed: Jul. 6, 2012

(65) Prior Publication Data

US 2013/0022809 A1    Jan. 24, 2013

Related U.S. Application Data

(60) Provisional application No. 61/508,707, filed on Jul. 18, 2011.

(51) Int. Cl.
*C03C 15/00* (2006.01)

(52) U.S. Cl.
USPC .................. 216/33; 216/20; 216/39; 438/509

(58) Field of Classification Search
USPC ........ 216/13, 19, 20, 33, 55, 56, 39; 438/405, 438/409, 522, 753, 509
See application file for complete search history.

(56) References Cited

U.S. PATENT DOCUMENTS

| | | | | |
|---|---|---|---|---|
| 5,045,437 | A * | 9/1991 | Bast | 430/320 |
| 5,549,778 | A * | 8/1996 | Yokoyama et al. | 156/246 |
| 6,224,703 | B1 * | 5/2001 | Yamasaki et al. | 156/89.16 |
| 2005/0051253 | A1 * | 3/2005 | Tosa et al. | 156/89.11 |

FOREIGN PATENT DOCUMENTS

| | | |
|---|---|---|
| EP | 1357593 | 10/2003 |
| EP | 1990331 | 11/2008 |
| EP | 2055374 | 5/2009 |
| EP | 2181978 | 5/2010 |

OTHER PUBLICATIONS

European Search Report and Notes to the European Search Report on European Patent Application No. EP 12 17 3735, dated Oct. 31, 2012 (16 pages).

(Continued)

*Primary Examiner* — Lan Vinh

(74) *Attorney, Agent, or Firm* — Buchanan Ingersoll & Rooney PC

(57) ABSTRACT

A unique and cost-effective method for producing a multilayer ceramic structure by using a first green film that contains a ceramic material, and the multilayer ceramic structure produced thereby. The method including the steps of:

(a) producing at least one porous region in the first green film, the at least one porous region extending from the surface of the first green film;

(b) applying a first layer, in sections, to the surface of the first green film, wherein one section of the first layer is located above the at least one porous region produced in step (a);

(c) positioning at least one additional green film on the surface of the first green film, to which the first layer has been applied;

(d) laminating the first green film and the at least one additional green film to form a green film composite; and (e) sintering the green film composite.

11 Claims, 2 Drawing Sheets

(56) References Cited

OTHER PUBLICATIONS

Khoong, L.E., Tan, Y.M., Lam, Y.C., "Overview on Fabrication of Three-Dimensional Structures in Multi-Layer Ceramic Substrate", Aug. 1, 2010, Journal of the European Ceramic Society, vol. 30, Issue No. 10 (pp. 1973-1987).

Malecha, Karol, Jurkow, Dominik, Golonka, Leszek J., "Comparison of Solvent and Sacrificial Volume-Material-based Lamination Processes of Low-Temperature Co-Fired Ceramics Tapes", Jun. 1, 2009, Journal of Micromechanics & Microengineering, vol. 19, Issue No. 6 (10 pages).

Bittner, A, Schmid, U., "The Porosification of Fired LTCC Substrates by Applying a Wet Chemical Etching Procedure", Jan. 1, 2009, Journal of the European Ceramic Society, vol. 29, No. 1 (6 pages).

Espinoza-Vallejos, P., Zhong, J., Gongora-Rubio, M., Sola-Laguna, L., Santiago-Aviles, J.J. (1998). Meso (Intermediate)-Scale Electromechanical Systems for the Measurement and Control of Sagging in LTCC Structures, MRS Proceedings, vol. 518, 73 doi:10.1557/PROC-518-73 (7 pages).

* cited by examiner

MULTILAYER CERAMIC STRUCTURE AND METHOD FOR PRODUCING THE SAME

CROSS-REFERENCE TO RELATED APPLICATIONS

This patent application claims the benefit of U.S. Provisional Patent Application No. 61/508,707, filed on Jul. 18, 2011, the disclosure of which is hereby incorporated by reference in its entirety.

TECHNICAL FIELD

The present invention generally relates to a multilayer ceramic structure and a method for producing the same.

BACKGROUND

Multilayer ceramic structures are used in a variety of fields, particularly for microelectronic components, for example, in telecommunications, for producing large-scale integrated pressure sensors or other sensors, for example, in the field of high-frequency technology, or for producing microfluid components.

One important and cost-effective method for producing multilayer ceramic structures of this type is "Low Temperature Cofired Ceramics", which will be abbreviated in what follows to "LTCC". In this technique, the required structures, such as conductor tracks, depressions, capacitors, resistors, coils, feedthroughs, etc., are inserted into or applied to unfired ceramic films (e.g., green films). These green films are then individually structured and then stacked and laminated. The laminated green film composite is then sintered.

For various applications, for example, for fluid or sensor applications, channel structures or other hollow cavities, adapted accordingly in terms of size, are required in a multilayer ceramic structure of this type.

To produce miniaturized channel structures, according to conventional methods, channel structures are introduced into green films of this type by means of, for example, stamping, laser, or embossing techniques, and must be stabilized in subsequent processing steps using pastes or films that contain graphite, or using organic materials, such as polymethylmethacrylate ("PMMA"). The stabilizing material escapes during the sintering process. With the known methods for producing channel structures, structures that are larger than 100 µm (laterally) and a maximum of 20 µm (vertically) can typically be produced. However, many applications require channel structures that have considerably smaller lateral and vertical dimensions to allow optimum adjustment of the dielectric constants. Moreover, it is disadvantageous that with the known processes, the volatility of the stabilizing material must be adjusted to the liquid phase sintering process and/or to the solidification of the glass phase, in order to ensure a complete escape of the stabilizing material.

A problem addressed by the present invention is therefore that of providing a simple and cost-effective method for producing a ceramic multilayer structure, with which hollow cavities and therefore channels or membrane structures can be produced, which have minimum dimensions of a few µm (horizontally and/or vertically) and typical maximum dimensions of a few 100 µm (horizontally), or have a tape layer (vertically), and which do not have the above-described problems relating to the stabilizing material. A problem is further that of providing a corresponding multilayer structure.

The present invention is directed toward overcoming one or more of the above-identified problems.

SUMMARY OF THE INVENTION

The above problem(s) is solved by a method for producing a ceramic multilayer structure using a first green film that contains a ceramic material.

The following method steps are proposed:

(a) Producing at least one porous region in the first green film, said region extending from the surface of the first green film;

(b) Applying a first layer, in sections, to the surface of the first green film, wherein one section of the first layer is located above the at least one porous region produced in step (a);

(c) Positioning at least one additional green film on the surface of the first green film, to which the first layer has been applied;

(d) Laminating the first green film and the at least one additional green film to form a green film composite; and (e) Sintering the green film composite.

In one exemplary embodiment of the present invention, the ceramic material of the first green film is embodied as polyphase, i.e., it has a first phase and at least one second phase.

In a method according to the present invention, at least one porous region is first produced locally in the first green film, which region extends from the surface of the first green film, wherein in one exemplary embodiment, the at least one porous region is produced by a selective etching process, for example, by using a suitable etching medium in combination with an etch-resistant mask or locally an etching paste applying. In one exemplary embodiment of the present invention, the first phase of the first green film, which is embodied as a glass phase or a metallic phase, is selectively removed in these porous regions, for example, by means of a wet chemical etching process.

A first layer is then printed on in sections, preferably as a paste, to a part of the surface of the first green film. In this case, the first layer is applied to the part of the surface of the first green film from which the porous regions extend. In one preferred exemplary embodiment, layer sections are provided only above the porous regions.

A method according to the present invention is based particularly on the knowledge that once an additional green film has been applied to the first green film, which has been provided with the first layer, and once said additional green film has been connected to said first green film by means of lamination to form a green film composite, the material of the first layer becomes liquid or softens during the subsequent sintering step and penetrates into the porous region of the first green film that lies below said first layer, and fills in the previously produced hollow cavities of the porous region. Accordingly, above the previously porous region, i.e., in the volume of the additional ceramic film that lies above said region and consists of the additional green film, a hollow cavity is produced, which is preferably embodied as a channel or membrane. A membrane in this case is a hollow cavity, which has a low height as compared with its lateral dimensions. The dimensions of this channel are determined by the size and porosity of the corresponding porous region in the first green film produced in step (a), by the volume of the section of the first layer located above the porous region, and by the shrinkage of the green films during lamination and sintering. In this case, the volume of the corresponding section of the first layer must be chosen such that the hollow cavities present in the porous region beneath said layer are filled in completely by the glass material, and no excess glass remains on the surface of the first green film.

It is advantageous in the above-described process for the maximum sintering temperature during step (e) to lie above the temperature at which the phase of the first layer, which is to penetrate into the hollow cavities of the porous region, for example, the first phase, becomes liquid or at least softens.

In a first exemplary embodiment, the first green film includes a glass ceramic material, and in step (a) the glass phase (first phase) is selectively removed, and preferably etched. In this exemplary embodiment, the first layer contains a glass material, preferably a glass material that corresponds to the glass phase removed in step (a). The glass material of the first layer softens during the sintering step (e), penetrates into the hollow cavities of the porous region, and fills them in. As a result, a hollow cavity, embodied as a channel or membrane structure, is formed in the additional ceramic film.

In a further exemplary embodiment, the first green film can also include a cermet material, i.e., a polyphase material consisting of at least one ceramic and at least one metal. The at least one metal preferably forms the matrix of the cermet material. In this exemplary embodiment, a metallic phase (first phase) is selectively removed, preferably via etching, in step (a). The first layer contains a metallic material, for example, the metal which corresponds to the metal removed in step (a). The metallic material of the first layer becomes liquid during the sintering step (e), penetrates into the hollow cavities of the porous region, and fills them in. As a result, a hollow cavity, which is embodied as a channel or membrane structure, is formed in the additional ceramic film that lies above the first layer. This exemplary embodiment can be used particularly for the production of integrated heat sinks.

In these exemplary embodiments, the volume of the section of the first layer is ideally chosen such that the entire volume of the section is taken up completely by the hollow cavities of the porous region, and no residual porosity remains in the porous region. As a result, material of the first layer is prevented from remaining in the region of the hollow cavity, which is formed in the additional film and is optionally present there unevenly distributed, and differences in concentration in the (original) porous region from the surrounding material of the ceramic film, which includes the first green film, are thus prevented.

In one exemplary embodiment of the present invention, the at least one porous region is produced in the first green film by positioning a protective layer, which is provided with corresponding through openings, and which can be an etch-resistant mask in the form of a prestructured template, on the first green film, and then applying an etching medium, which penetrates through the through openings in the etch-resistant mask into the first green film. The etching medium preferably selectively removes the first phase from the first green film only in the region or regions of the first green film that are accessible through the through openings in the protective layer above said green film. This is a particularly simple method for producing the at least one porous region in the first green film.

In one exemplary embodiment of the present invention, the through openings in the protective layer, which is positioned on the first green film, are produced by masking the protective layer with a masking layer, and etching the through openings. In this case, the masking layer has corresponding through openings, through which the etching medium penetrates to the protective layer underneath said masking layer, removing said protective layer. In this manner, openings can be produced in the protective layer that are small enough that when the method of the present invention has been completed, hollow cavities having, for example, a horizontal (lateral) dimension (width, depth) of less than 80 μm result in the multilayer structure.

The masking layers can be, for example, an organic, protective layer that can be photostructured, and which does not serve to stabilize the channel/membrane structures (as is the case with PMMA), but instead escapes much earlier (prior to the liquid phase sintering process). A localized increase in porosity can thereby be enabled. Imprinting the green film with organic layers is also conceivable. In this case, for example, application via stamping would be possible.

Alternatively, the protective layer can be printed onto the first green film that is provided with the glass layer. In this case, the through openings in the protective layer are produced by a corresponding structuring of the printing plate. However, the horizontal dimensions of the channel structures that can be produced in the resulting multilayer ceramic structure using this protective layer are typically greater than 80 μm.

Also conceivable is an approach in which a prestructured template or shadow mask is used as the protective layer. In the context of the present patent application, this is a thin film—for example, made of metal or ceramic—containing openings where the etching medium can pass through and modify the green films. The template or shadow mask, which is made of, for example, $Al_2O_3$ or silicon, must be aligned with the green body and must be highly resistant to etching. In addition, a soft layer, for example, of tetrafluoroethylene, can be arranged on the underside of the template or shadow mask (in other words, facing the green body). In this manner, enhanced contact with the green film can be produced, so that the seal between the template and the green film is improved, thereby reducing any lateral sub-etching of the green body.

It is also alternatively conceivable to use a prestructured template in the form of an etch-resistant, structured organic film, which is laminated or glued to the green film.

According to a further embodiment, no protective layer is applied, and instead the etching medium is applied locally, for example, using highly viscous etching pastes. Application is carried out, for example, by printing on the etching paste which contains hydrofluoric acid, for example, and thus acts on the glass matrix locally. Alternatively, the etching medium can also be stamped on.

As was already described above, in one exemplary embodiment, the first layer contains a glass phase or a metallic phase, which preferably corresponds to the first phase that was selectively removed in step (a).

The above problem(s) is further solved with a ceramic multilayer structure that can be produced or is produced according to a method described above.

An advantage of a multilayer ceramic structure of this type consists in that very small hollow cavities, i.e., channels or membranes, can be produced with any dimensions, up to a maximum of the layer thickness of the film produced from the applied glass layer (vertically), and/or from a few μm up to any size in terms of width or depth (horizontally or laterally). In this manner, complex membrane structures, which can be used in large-scale integrated pressure sensors, for example, can be produced. Fine channel structures of this type can also be used for application such as fluid or sensor applications. Moreover, hollow cavities of this type can also be used in the field of high frequency components, because regions having a low dielectric constant are selectively distributed in the hollow cavities of the ceramic body due to the enclosed gas atmosphere (e.g., air), and therefore a lower, effective dielectric constant is present in the medium between the antenna elements and the material surface. With the resulting lower capacitive coupling in the substrate, the performance of the antenna elements can be enhanced.

According to the present invention, a multilayer ceramic structure of this type has one or more hollow cavities measuring at least 10 μm in width (horizontal dimension) and/or at least 5 μm in height (vertical dimension). When the method according to the present invention is used, high dimensional stability of the one or more hollow cavities, as compared with the use of additional organic materials, is also achieved, because the one or more hollow cavities are first formed during the sintering phase and not during the release phase, as the first layer is ideally held entirely within the porous region of the first green film. It can therefore be ensured that a comparatively flat surface topography can be achieved on the LTCC module, despite the hollow cavities that are present and, therefore, screen-printed structures can be realized on the LTCC module surface with high structural precision and positioning accuracy.

Additional goals, features, advantages and possible applications of the present invention are provided in the following description of exemplary embodiments of the method according to the present invention, and of the multilayer ceramic structure according to the present invention, in reference to the Figures. All described and/or illustrated features, alone or in any combination, constitute the subject matter of the present invention, regardless of their combination in the claims or the dependency references thereof.

Various other objects, aspects and advantages of the present inventive disclosure can be obtained from a study of the specification, the drawings, and the appended claims.

DETAILED DESCRIPTION

Figure 1:
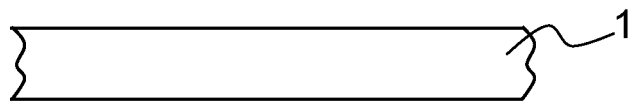
FIG. 1 illustrates a first green film in the starting condition.

FIG. 1 shows a cross-section of a first green film 1, made of, for example, a glass ceramic material, in its starting condition. The 951 low-temperature cofire dielectric tape from the Dupont company, having a thickness of between 100 μm and 270 μm, can be used as the first green film 1, for example. This first green film 1 is then provided with a prestructured template or shadow mask 2, which has a "soft" underside and through openings 4. The "soft" underside adapts to the surface contour of the green tape. This "soft" underside—in other words the side that faces the green film 1—can be made, for example, of tetrafluoroethylene. Rather than a template, which protects the structures, the use of stamps or the stamping of the etching medium is also possible. Printed protective lacquers may also be used.

Alternatively, the protective lacquer layer 2 can also be applied to the first green film 1 as a continuous masking layer, for example, also by means of printing using a known screen printing process. The masking layer has corresponding structures (through openings), through which an etching medium (e.g., hydrofluoric acid) etches the protective lacquer layer 2 so as to produce the through openings 4, as shown in FIG. 2.

Figure 2:
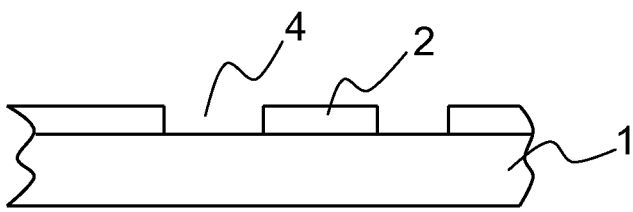
FIG. 2 illustrates the first green film with a protective layer.
Figure 3:
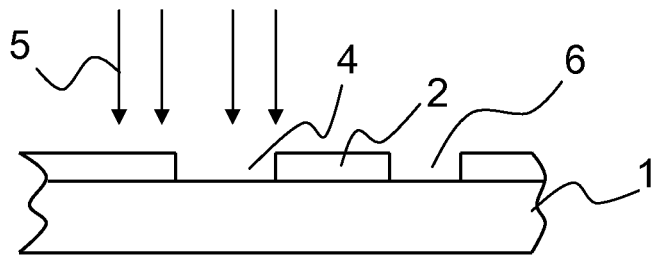
FIG. 3 illustrates the system according to FIG. 2 using an etching medium.
Figure 4:
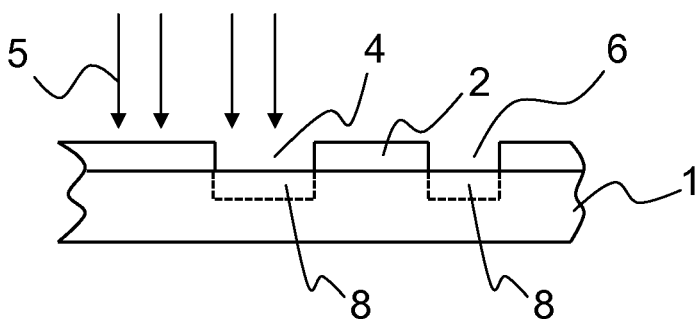
FIG. 4 illustrates the system according to FIG. 3 at the end of the etching process.
Figure 5:
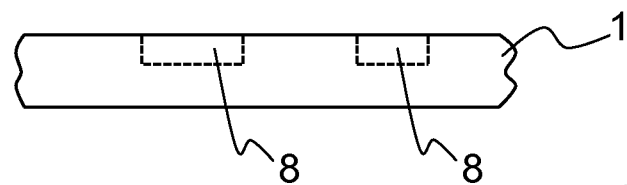
FIG. 5 illustrates the first green film after removal of the etching medium and the etch-resistant mask.
Figure 6:
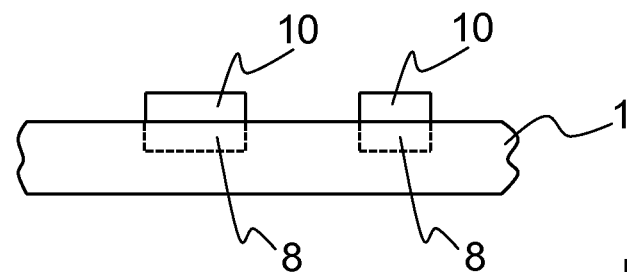
FIG. 6 illustrates the first green film after the application of a glass layer in sections.

The green film 1 illustrated in FIG. 2, with the prestructured template 2 containing the through openings 4, is then etched. As is shown in FIG. 3, the etching medium 6 is applied from the top (see arrows 5) to the surface of the template 2 and/or the green film 1. The etching medium 6, for example, the hydrofluoric acid, is applied at room temperature and penetrates through the through openings 4 into the green film 1. The etching medium 6 is selected such that, in this exemplary embodiment comprising a glass ceramic green film 1, it selectively etches the glass phase, so that the porous regions 8 in the green film 1, as shown in FIGS. 4 to 7, result.

With an alternative use of cermet material (for example, a hard metal comprising wolfram carbide with a cobalt matrix) as the first green film 1, a metallic phase (the metallic cobalt in the cited example) is preferably etched by means of the etching medium.

The etching medium 6 is then washed away with water, for example, and the prestructured etch-resistant mask 2 (for example, the template) is removed. If an organic based etch-resistant mask is used, removal can be carried out in this exemplary embodiment by, for example, means of incineration in an air stream heated to approximately 300° C., or in an air atmosphere heated to the same temperature. Other thermal processes are also possible. The result is the green film 1 with porous regions 8 shown in FIG. 5.

A glass layer 10 (first layer) is then arranged in sections on a part of the surface of the green film 1, specifically where the surface is porous in the regions 8, for example. In one exemplary embodiment, the glass layer 10 is printed on by means of screen printing, resulting in the structure shown in FIG. 6. One of the materials 9615, 5137, QQ550 and/or QQ620 of the Dupont company can be used as the glass layer 10, for example. In this case, the glass layer 10 can also extend into the regions of the surface of the green film 1 that are not porous. The volume of the sections of the glass layer 10 is chosen such that in the subsequent sintering step, all of the material of the section of the glass layer 10 that is assigned to a porous region 8 is taken up therein, and fills it back in.

Figure 7:
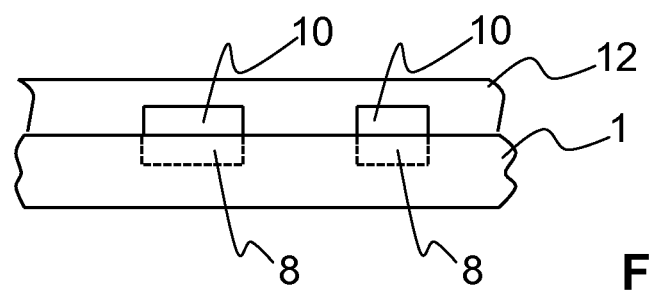
FIG. 7 illustrates the system according to FIG. 6 with an additional green film.

A second green film 12 is then placed on the surface of the first green film 1 that is provided with the glass layer 10 (see FIG. 7). The two green films 1 and 12 are then laminated, isostatically or uniaxialy, at approximately 2000 to 6000 PSI for approximately 3 to 7 minutes—depending on the desired shrinkage behavior. A material or product dependent sintering step is then carried out, which has the peak temperature of approximately 875° C., for example, which is typical for LTCC material.

Figure 8:
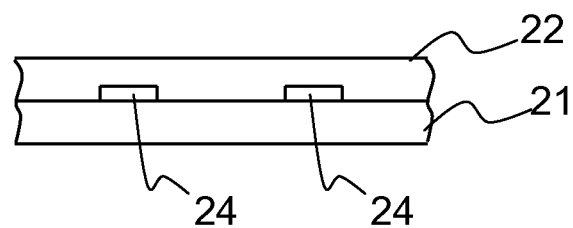
FIG. 8 illustrates the sintered multilayer ceramic structure according to the present invention.

During the sintering step, the material of the glass layer 10 becomes liquid, penetrates into the hollow cavities of the porous regions 8, and fills these back in. Accordingly, hollow cavities 24 are formed in the green film 12 above said first layer 1. Consequently, the sintered ceramic and multilayer structure according to the present invention, as shown in FIG. 8, has a first ceramic film 21, produced from the first green film 1, a second ceramic film 22, which results from the second green film 12, and hollow cavities 24, which remain after the glass material of the glass layer 10 has migrated into the hollow cavities of the porous regions 8. The hollow cavities 24 produced in the multilayer structure using the method according to the present invention have dimensions of a few μm to a few mm horizontally (laterally) and a few μm to 100 μm vertically (with the horizontal and vertical directions as indicated in FIG. 8).

In the exemplary embodiment of the method according to the present invention and the multilayer structure according to the present invention, as shown in FIGS. 1 to 8 and described herein, a 2-layered structure is specified. The inventive method can also be embodied accordingly for structures having more than 2 layers.

The above method is a simple but unique, cost-effective and widely applicable method by which hollow cavity structures having dimensions of a few μm laterally and/or vertically can be produced.

It will be apparent to those skilled in the art that numerous modifications and variations of the described examples and embodiments are possible in light of the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof. Additionally, the disclosure of a range of values is a disclosure of every numerical value within that range.

LIST OF REFERENCE SYMBOLS 1 first green film
2 etch-resistant mask
4 through opening in the prestructured etch-resistant mask 2
5 arrow
6 etching medium
8 porous region
10 glass layer
12 second green film
21 first ceramic film
22 second ceramic film
24 hollow cavity

We claim:

1. A method for producing a multilayer ceramic structure using a first green film that contains a ceramic material, comprising the following steps:
    (a) producing at least one porous region in the first green film, said at least one porous region extending from the surface of the first green film;
    (b) applying a first layer, in sections, to the surface of the first green film, wherein one section of the first layer is located above the at least one porous region produced in step (a);
    (c) positioning at least one additional green film on the surface of the first green film, to which the first layer has been applied;
    (d) laminating the first green film and the at least one additional green film to form a green film composite; and
    (e) sintering the green film composite, wherein during sintering material of the first layer becomes liquid or softens and substantially fills the at least one porous region in the first green film forming at least one hollow cavity in the at least one additional green film of the green film composite.

2. The method according to claim 1, wherein the at least one porous region in the first green film is produced by arranging an etch resistant mask, which is provided with a corresponding through opening, on the first green film, and then using an etching medium, which penetrates through the through opening in the etch resistant mask into the first green film, wherein the etching medium selectively etches the first phase.

3. The method according to claim 1, wherein the first layer is printed on.

4. The method according to claim 1, wherein the ceramic material has a first phase and at least one second phase.

5. The method according to claim 4, wherein the at least one porous region is produced in the first green film by selectively removing the first phase in this region by means of etching.

6. The method according to claim 5, wherein the first phase comprises a glass phase or a metallic phase.

7. The method according to claim 4, wherein the first layer contains the first phase.

8. The method according to claim 7, wherein the first phase comprises a glass phase or a metallic phase.

9. A method for producing a multilayer ceramic structure using a first green film that contains a ceramic material, comprising the following steps:
    (a) producing a plurality of porous regions in the first green film, said plurality of porous regions extending from the surface of the first green film;
    (b) applying a first layer having a first phase, in sections, to the surface of the first green film, wherein the sections of the first layer are located above the plurality of porous regions produced in step (a);
    (c) positioning at least one additional green film on the surface of the first green film, to which the first layer has been applied;
    (d) laminating the first green film and the at least one additional green film to form a green film composite; and
    (e) sintering the green film composite, wherein during sintering material of the sections of the first layer changes phase and substantially fill the plurality of porous regions in the first green film forming a plurality of hollow cavities in the at least one additional green film of the green film composite.

10. The method according to claim 9, wherein the first phase of the material of the first layer comprises a glass phase or a metallic phase.

11. The method according to claim 9, wherein the material of the first layer becomes liquid or softens to change phase and substantially fill the plurality of porous regions in the first green film forming the plurality of hollow cavities in the at least one additional green film of the green film composite.

* * * * *